US010297748B2

(12) United States Patent
Lv et al.

(10) Patent No.: US 10,297,748 B2
(45) Date of Patent: May 21, 2019

(54) THREE-TERMINAL ATOMIC SWITCHING DEVICE AND METHOD OF MANUFACTURING THE SAME

(71) Applicant: INSTITUTE OF MICROELECTRONICS, CHINESE ACADEMY OF SCIENCES, Beijing (CN)

(72) Inventors: Hangbing Lv, Beijing (CN); Ming Liu, Beijing (CN); Qi Liu, Beijing (CN); Shibing Long, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/539,608

(22) PCT Filed: Dec. 26, 2014

(86) PCT No.: PCT/CN2014/095081

§ 371 (c)(1),
(2) Date: Jun. 23, 2017

(87) PCT Pub. No.: WO2016/101247

PCT Pub. Date: Jun. 30, 2016

(65) Prior Publication Data

US 2017/0352806 A1 Dec. 7, 2017

(51) Int. Cl.
*H01L 45/00* (2006.01)
*H01L 27/24* (2006.01)

(52) U.S. Cl.
CPC ...... *H01L 45/1206* (2013.01); *H01L 27/2481* (2013.01); *H01L 45/00* (2013.01);
(Continued)

(58) Field of Classification Search
CPC ............... H01L 45/1206; H01L 45/124; H01L 27/2481; H01L 45/1233; H01L 27/2463
See application file for complete search history.

(56) References Cited

U.S. PATENT DOCUMENTS 8,737,114 B2 * 5/2014 Sandhu .................. H01L 45/08 257/2
9,331,275 B2 * 5/2016 Sandhu .................. H01L 45/08
(Continued)

FOREIGN PATENT DOCUMENTS

CN 101840995 A 9/2010
CN 101866940 A 10/2010
(Continued)

OTHER PUBLICATIONS

International Search Report with translation from corresponding PCT Application No. PCT/CN2014/095081 dated Oct. 12, 2015.

*Primary Examiner* — Nicholas J Tobergte
(74) *Attorney, Agent, or Firm* — Christensen, Fonder, Dardi & Herbert PLLC

(57) ABSTRACT

There is provided a three-terminal atomic switching device and a method of manufacturing the same, which belongs to the field of microelectronics manufacturing and memory technology. The three-terminal atomic switching device includes: a stack structure including a source terminal and a drain terminal; a vertical trench formed by etching the stack structure; an $M_8XY_6$ channel layer formed on an inner wall and a bottom of the vertical trench; and a control terminal formed on a surface of the $M_8XY_6$ channel layer, wherein the control terminal fills the vertical trench. The source terminal resistance and the drain terminal resistance are controlled by the control terminal. The invention is based on the three-terminal atomic switching device, and realizes high switching ratio characteristic, simple structure, easy integration, high density and low cost due to high non-
(Continued)

linearity of the source-drain resistance with respect to the control terminal voltage, and thus can be used in a gated device in a cross-array structure to inhibit a crosstalk phenomenon caused by the leakage current. The three-terminal atomic switching device proposed by the invention is suitable for a planar stacked cross-array structure and a vertical cross-array structure, so as to realize high-density three-dimensional storage.

22 Claims, 4 Drawing Sheets

(52) U.S. Cl.
CPC ........ *H01L 45/124* (2013.01); *H01L 45/1608* (2013.01); *H01L 45/1675* (2013.01); *H01L 45/1683* (2013.01); *H01L 27/2463* (2013.01); *H01L 45/06* (2013.01); *H01L 45/1233* (2013.01); *H01L 45/141* (2013.01); *H01L 45/147* (2013.01)

(56) References Cited

U.S. PATENT DOCUMENTS

| | | | | |
|---|---|---|---|---|
| 9,478,740 | B2 * | 10/2016 | Sandhu | H01L 45/08 |
| 9,548,115 | B2 * | 1/2017 | Tada | G11C 13/0002 |
| 9,812,638 | B2 * | 11/2017 | Bethune | H01L 45/00 |
| 2010/0178729 | A1 * | 7/2010 | Yoon | H01L 27/249<br>438/104 |
| 2011/0227023 | A1 * | 9/2011 | Bethune | H01L 45/00<br>257/4 |

FOREIGN PATENT DOCUMENTS

| | | | |
|---|---|---|---|
| CN | 102931347 | A | 2/2013 |
| CN | 104465989 | A | 3/2015 |

* cited by examiner

THREE-TERMINAL ATOMIC SWITCHING DEVICE AND METHOD OF MANUFACTURING THE SAME

CROSS REFERENCE TO RELATED APPLICATIONS

This application is a national stage filing of PCT Application Number PCT/CN2014/095081 filed Dec. 26, 2014, is hereby incorporated herein by reference.

TECHNICAL FIELD

The present disclosure relates to the field of microelectronics, and more particularly to a three-terminal atomic switching device suitable for a gated device integrated in a passive cross-array and a method of manufacturing the same.

BACKGROUND

A resistive memory, such as a resistive random access memory, a phase change memory and a magnetic memory, is highly concerned worldwide due to its excellent characteristics in cell area, three-dimensional integration, low power consumption, high erasing and writing speed and multi-value storage and so on.

The array architecture of the resistive random access memory can be divided into passive cross-arrays and active arrays. In the passive cross-array, each memory cell is defined by upper and lower electrodes consisting of intersecting word and bit lines, and the smallest memory cell area—$4F^2$ can be achieved in the planar structure, where F is the feature size. Passive cross-arrays can be stacked in multiple layers due to the independency from the front end of line (FEOL), to achieve a three-dimensional storage architecture. The effective area of each memory cell is only $4F^2/N$, where N is the number of layers stacked. However, the low-impedance state of the resistive random access memory in the passive cross-array architecture presents an ohmic conduction characteristic. When the resistance of adjacent cross points is read, the crosstalk effect is readily to occur. Taking the 2×2 cross-array shown in FIG. 1 as an example, if three adjacent cross points (1,2), (2,2) and (2,1) are in a low-impedance state, the point (1,1) will have its resistance readout as being a low resistance, regardless of whether the actual resistance thereof is in a high-impedance state or a low-impedance state. When the storage array becomes larger or multi-layer arrays are stacked, the leakage phenomenon will be more serious.

To address the misreading phenomenon caused by the crosstalk, generally a two-terminal device with a non-linear resistance, such as a threshold transition device, a Schottky diode or the like, can be connected in series with the resistance transition device.

However, at present, the two-terminal non-linear resistor generally has a low switching ratio, large leakage current. Further, the threshold transition device must have its transition voltage matched to the operating voltage of the resistive memory. This increases the difficulty in designing the two-terminal non-linear resistor.

SUMMARY

I Problems to be Solved

In view of the above, the present invention aims to provide, among others, a three-terminal atomic switching device suitable for a gated device integrated in a resistive memory passive cross-array and a method of manufacturing the same, so as to improve the switching ratio of the gated device, and eliminate the leakage current in the passive cross-array.

II Solutions

In order to achieve the above object, the present invention provides a three-terminal atomic switching device, comprising a stack structure including a source terminal 301 and a drain terminal 302, a vertical trench formed by etching the stack structure, an $M_8XY_6$ channel layer 501 formed at an inner wall and bottom of the vertical trench, and a control terminal 601 formed on a surface of the $M_8XY_6$ channel layer 501, wherein the control terminal 601 fills the vertical trench.

In the above scheme, in the stack structure including the source terminal 301 and the drain terminal 302, the drain terminal 302 is formed on the source terminal 301, and the source terminal 301 is isolated from the drain terminal 302 by a second insulating dielectric layer 202, the drain terminal 302 is further covered with a third insulating dielectric layer 203, and the source terminal 301 is isolated from the substrate by a first insulating dielectric layer 201 thereunder.

In the above scheme, the source terminal 301 and the drain terminal 302 are made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO. The source terminal 301 and the drain terminal 302 are formed by electron beam evaporation, chemical vapor deposition, pulsed laser deposition, atomic layer deposition or magnetron sputtering with a thickness of 1 nm to 500 nm.

In the above scheme, the vertical trench penetrates through the third insulating dielectric layer 203 covering the drain terminal 302, the drain terminal 302, the second insulating dielectric layer 202 between the source terminal 301 and the drain terminal 302, and the source terminal 301 in this order, wherein the bottom of the vertical trench is formed in the first insulating dielectric layer 201 below the source terminal 301.

In the above scheme, in the $M_8XY_6$ channel layer 501 formed on the inner wall and the bottom of the vertical trench, M is any one of Cu, Ag, Li, Ni or Zn, X is any one of Ge, Si, Sn, C or N, and Y is any one of Se, S, O, or Te.

In the above scheme, the $M_8XY_6$ channel layer 501 also comprises a $M_8XY_6$ material doped with one or more of N, P, Zn, Cu, Ag, Li, Ni, Zn, Ge, Si, Sn, C, N, Se, S, O, Te, Br, Cl, F, or I.

In the above scheme, the $M_8XY_6$ channel layer 501 is formed by electron beam evaporation, chemical vapor deposition, pulsed laser deposition, atomic layer deposition, or magnetron sputtering with a thickness of 1 nm to 500 nm.

In the above scheme, the control terminal 601 is formed in the vertical trench with the inner wall thereof covered with the $M_8XY_6$ channel layer 501, and a top surface of the control terminal 601 is flushed with a top surface of the third insulating dielectric layer 203 covering the drain terminal 302.

In the above scheme, the control terminal 601 is made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO. The control terminal 601 is formed by electron beam evaporation, chemical vapor deposition, pulsed laser deposition, atomic layer deposition or magnetron sputtering.

In the above scheme, the three-terminal atomic switching device further comprises one or more dielectric layers between the $M_8XY_6$ channel layer 501 and the control terminal 601, which are formed by electron beam evaporation, chemical vapor deposition, pulsed laser deposition, atomic layer deposition, spin coating or magnetron sputtering with a thickness of 0.5 nm to 50 nm.

In the above scheme, the dielectric layer is made of any one selected from an inorganic material of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO or STO, or any one selected from an organic material of TCNQ, PEDOT, P3HT, PCTBT, and the like.

In order to achieve the above object, the present invention also provides a method of manufacturing a three-terminal atomic switching device, comprising: forming a stack structure including a source terminal 301 and a drain terminal 302; etching the stack structure to form a vertical trench; forming an $M_8XY_6$ channel layer 501 on an inner wall and a bottom of the vertical trench; and forming a control terminal 601 on a surface of the $M_8XY_6$ channel layer 501, wherein the control terminal 601 fills the vertical trench.

In the above scheme, the step of forming a stack structure including a source terminal 301 and a drain terminal 302 comprises forming firstly a first insulating dielectric layer 201 on a substrate, and then, forming a source terminal 301 on the first insulating dielectric layer 201, and then, forming a second insulating dielectric layer 202 on the source terminal 301, and then, forming the drain terminal 302 on the second insulating dielectric layer 202, and finally, forming a third insulating dielectric layer 203 on the drain terminal 302, thus forming the stack structure including the source terminal 301 and the drain terminal 302.

In the above scheme, the source terminal 301 and the drain terminal 302 are formed by electron beam evaporation, chemical vapor deposition, pulsed laser deposition, atomic layer deposition, or magnetron sputtering, and the first to third insulating dielectric layers are formed by chemical vapor deposition or sputtering.

In the above scheme, the step of etching the stack structure to form a vertical trench comprises etching through the third insulating dielectric layer 203, the drain terminal 302, the second insulating dielectric layer 202, and the source terminal 301 in the stack structure by photolithography and etching, and the etching stops in the first insulating dielectric layer 201 below the source terminal 301.

In the above scheme, the photolithography comprises conventional photolithography, electron beam exposure, or nano-imprinting, and the etching comprises dry etching or wet etching. A single step etching process is used to form the trench at one time, or alternatively a multi-step etching process is used to etch the insulating dielectric layers and the drain terminal separately.

In the above scheme, the step of forming an $M_8XY_6$ channel layer 501 on an inner wall and a bottom of the vertical trench comprises forming an $M_8XY_6$ channel layer 501 by electron beam evaporation, chemical vapor deposition, pulsed laser deposition, atomic layer deposition, or magnetron sputtering.

In the above scheme, the step of forming a control terminal 601 on a surface of the $M_8XY_6$ channel layer 501 comprises forming the control terminal 601 in the vertical trench with the inner wall thereof covered with the $M_8XY_6$ channel layer by any one of electron beam evaporation, chemical vapor deposition, pulsed laser deposition, atomic layer deposition, or magnetron sputtering.

In the above scheme, the step of forming a control terminal 601 on a surface of the $M_8XY_6$ channel layer 501 further comprises planarizing the control terminal 601 and the $M_8XY_6$ channel layer 501, forming a bit line for a vertical cross-array structure, thereby forming a three-terminal atomic switching device.

In the above scheme, the planarizing comprises performing planarization process on the control terminal 601 and the $M_8XY_6$ channel layer 501 by chemical mechanical polishing to remove horizontal portions of the control terminal 601 and the $M_8XY_6$ channel layer 501 completely.

In the above scheme, between the step of forming the $M_8XY_6$ channel layer 501 on the inner wall and the bottom of the vertical trench and the step of forming the control terminal 601 on the surface of the $M_8XY_6$ channel layer 501, the method further comprises forming one or more dielectric layers on the surface of the $M_8XY_6$ channel layer 501 by electron beam evaporation, chemical vapor deposition, pulsed laser deposition, atomic layer deposition, spin coating or magnetron sputtering, with a thickness of 0.5 nm to 50 nm.

In the above scheme, the planarizing comprises performing planarization process on the control terminal 601, the dielectric layer, and the $M_8XY_6$ channel layer 501 by chemical mechanical polishing to remove horizontal portions of the control terminal 601, the dielectric layer, and the $M_8XY_6$ channel layer 501 completely.

III Advantages

In view of the above solutions, the present invention has the following advantages.

1. The invention utilizes such a characteristic that the metal ion concentration in the $M_8XY_6$ channel layer is controlled by a voltage at the control terminal so that the channel layer has a resistance which exhibits high non-linearity with respect to the gate voltage, which is suitable for the gated device in the passive cross-array of the resistive memory.

2. The resistance of the $M_8XY_6$ channel layer in the invention is controlled by the control terminal, while the operating voltage of the resistance transition device is determined by the source and drain terminals. Thus, the operating voltage of the gated device and the operating voltage of the resistance transition device can be independently designed, resulting in reduced difficulty in the design of the gated device.

3. One or more dielectric layers can be included between the $M_8XY_6$ channel layer and the control terminal in the invention.

In view of the above, the present invention provides a three-terminal atomic switching structure suitable for a gated device integrated in a passive cross-array and a method of manufacturing the same.

DETAILED DESCRIPTION

Figure 1:
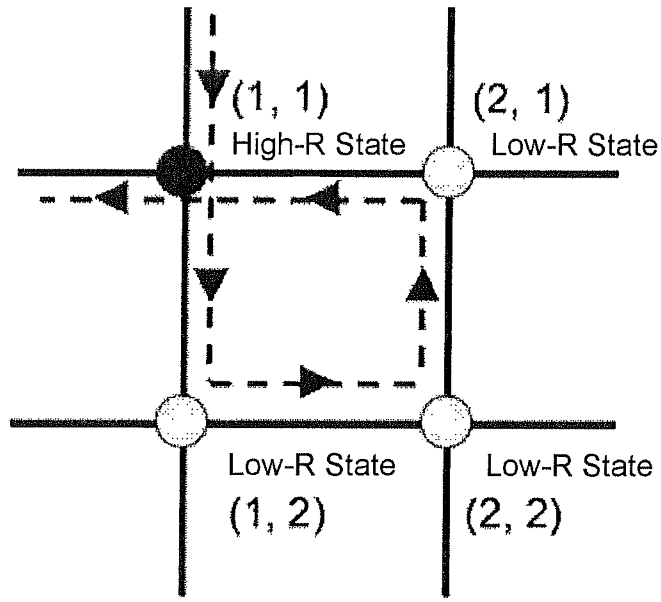
FIG. 1 is a schematic diagram showing a read crosstalk phenomenon in a passive cross-array structure.

The invention will now be described more fully hereinafter with reference to embodiments thereof in conjunction to the accompanying drawings. The invention provides some embodiments, but should not be considered as being limited to the embodiments set forth herein. In the drawings, the thickness of layers and areas is enlarged for clarity, but those schematic diagrams should not be considered as reflecting the exact proportional relationship of the geometric size. The accompanying drawings illustrate idealized embodiments of the present invention, and the embodiments of the invention should not be considered as being limited to the specific shapes of the areas shown in the drawings, but rather comprise some shapes resulting therefrom. The drawings are illustrative, but should not be considered as limiting the scope of the invention.

The invention is based on a three-terminal atomic switching device, and realizes high switching ratio characteristic, simple structure, easy integration, high density and low cost due to high non-linearity of a source-drain resistance with respect to a control terminal voltage, and thus can be used in a gated device in a cross-array structure to inhibit a crosstalk phenomenon caused by the leakage current. The three-terminal atomic switching device proposed by the invention is suitable for a planar stacked cross-array structure and a vertical cross-array structure, so as to realize high-density three-dimensional storage.

Figure 2:
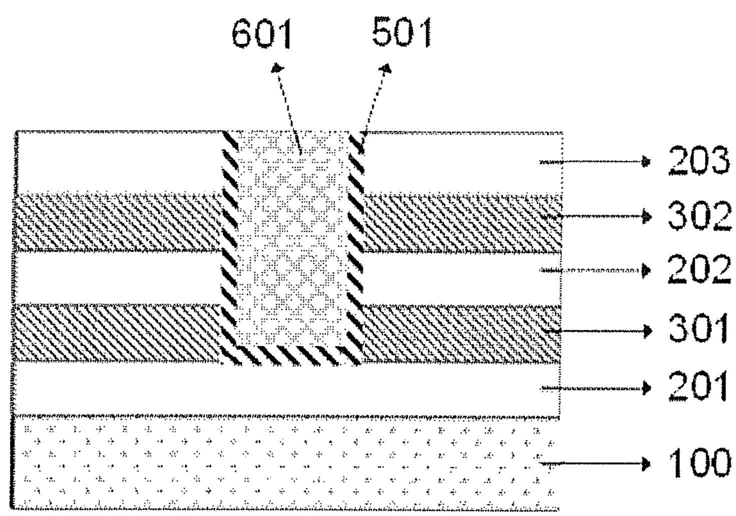
FIG. 2 is a schematic structural view showing a three-terminal atomic switching device according to an embodiment of the present invention.

FIG. 2 is a schematic structural view showing a three-terminal atomic switching device according to an embodiment of the present invention. As shown in FIG. 2, the three-terminal atomic switching device comprises a stack structure including a source terminal 301 and a drain terminal 302, a vertical trench formed by etching the stack structure, an $M_8XY_6$ channel layer 501 formed on an inner wall and the bottom of the vertical trench, and a control terminal 601 formed on a surface of the $M_8XY_6$ channel layer 501. The control terminal 601 fills the vertical trench. The resistance of the source terminal 301 and the resistance of the drain terminal 302 are controlled by the control terminal 601.

In the stack structure including the source terminal 301 and the drain terminal 302, the drain terminal 302 is formed on the source terminal 301, the source terminal 301 is isolated from the drain terminal 302 by a second insulating dielectric layer 202, the drain terminal 302 is further covered with a third insulating dielectric layer 203, and the source terminal 301 is isolated from a substrate by a first insulating dielectric layer 201 thereunder.

The source terminal 301 and the drain terminal 302 are made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO. The source terminal 301 and the drain terminal 302 are deposited by electron beam evaporation, chemical vapor deposition, pulsed laser deposition, atomic layer deposition or magnetron sputtering with a thickness of 1 nm to 500 nm.

The vertical trench penetrates through the third insulating dielectric layer 203 covering the drain terminal 302, the drain terminal 302, the second insulating dielectric layer 202 between the source terminal 301 and the drain terminal 302, and the source terminal 301 in this order. The bottom of the vertical trench is formed in the first insulating dielectric layer 201 below the source terminal 301.

In the $M_8XY_6$ channel layer 501 formed on the inner wall and the bottom of the vertical trench, M is any one of Cu, Ag, Li, Ni or Zn, X is any one of Ge, Si, Sn, C or N, and Y is any one of Se, S, O, or Te. The $M_8XY_6$ channel layer 501 can also comprise a $M_8XY_6$ material doped with one or more of N, P, Zn, Cu, Ag, Li, Ni, Zn, Ge, Si, Sn, C, N, Se, S, O, Te, Br, Cl, F, or I. The $M_8XY_6$ channel layer 501 is deposited by electron beam evaporation, chemical vapor deposition, pulsed laser deposition, atomic layer deposition, or magnetron sputtering with a thickness of 1 nm to 500 nm.

The control terminal 601 is formed in the vertical trench with the inner wall thereof covered with the $M_8XY_6$ channel layer 501, and has a top surface thereof flushed with a top surface of the third insulating dielectric layer 203 covering the drain terminal 302. The control terminal 601 is made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO. The control terminal 601 is formed by electron beam evaporation, chemical vapor deposition, pulsed laser deposition, atomic layer deposition or magnetron sputtering.

Further, as a preferred embodiment of the present invention, there may be one or more dielectric layers further included between the $M_8XY_6$ channel layer 501 and the control terminal 601. The dielectric layer(s) may be made of any one of an inorganic material of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO or STO, or any one of an organic material of TCNQ, PEDOT, P3HT, PCTBT, and the like. The dielectric layer(s) may be deposited by electron beam evaporation, chemical vapor deposition, pulsed laser deposition, atomic layer deposition, spin coating or magnetron sputtering with a thickness of 0.5 nm to 50 nm.

Figure 3:
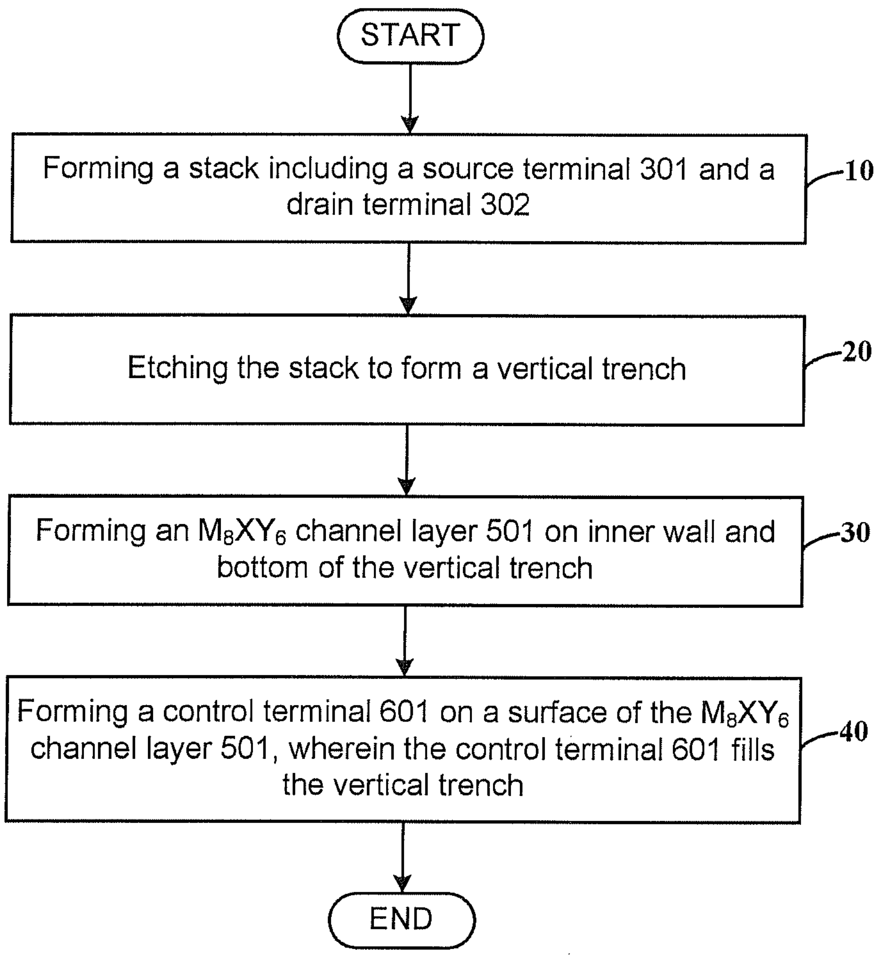
FIG. 3 is a flow chart showing a method of manufacturing a three-terminal atomic switching device according to an embodiment of the present invention.

Based on the three-terminal atomic switching device shown in FIG. 2, the present invention also provides a method of manufacturing the three-terminal atomic switching device as shown in FIG. 3, which comprises the steps of:

Step 10: forming a stack structure comprising a source terminal 301 and a drain terminal 302;

This step comprises forming firstly a first insulating dielectric layer 201 on a substrate, and then, forming a source terminal 301 on the first insulating dielectric layer 201, and then, forming a second insulating dielectric layer 202 on the source terminal 301, and then, forming a drain terminal 302 on the second insulating dielectric layer 202, and finally, forming a third insulating dielectric layer 203 on the drain terminal 302, thus forming the stack structure including the source terminal 301 and the drain terminal 302. The source terminal 301 and the drain terminal 302 are deposited by electron beam evaporation, chemical vapor deposition, pulsed laser deposition, atomic layer deposition, or magnetron sputtering, and the first to third insulating dielectric layers are formed by chemical vapor deposition or sputtering.

Step 20: etching the stack structure to form a vertical trench;

This step comprises etching through the third insulating dielectric layer 203, the drain terminal 302, the second insulating dielectric layer 202, and the source terminal 301 in the stack structure by using photolithography and etching. The etching stops in the first insulating dielectric layer 201 below the source terminal 301. The photolithography comprises conventional photolithography, electron beam exposure, or nano-imprinting, and the etching comprises dry etching or wet etching. A single step etching process can be used to form the trench at one time, or alternatively a multi-step etching process can be used to etch the insulating dielectric layers and the drain terminal separately.

Step 30: forming an $M_8XY_6$ channel layer 501 on an inner wall and the bottom of the vertical trench;

This step comprises depositing the $M_8XY_6$ channel layer 501 by electron beam evaporation, chemical vapor deposition, pulsed laser deposition, atomic layer deposition, or magnetron sputtering.

Step 40: forming a control terminal 601 on a surface of the $M_8XY_6$ channel layer 501 to fill up the vertical trench;

this step comprises forming the control terminal 601 in the vertical trench with the inner wall thereof covered with the $M_8XY_6$ channel layer by any of electron beam evaporation, chemical vapor deposition, pulsed laser deposition, atomic layer deposition, or magnetron sputtering.

Further, forming the control terminal 601 on the surface of the $M_8XY_6$ channel layer 501 further comprises planarizing the control terminal 601 and the $M_8XY_6$ channel layer 501, forming a bit line for a vertical cross-array structure, thereby forming a three-terminal atomic switching device. The planarizing comprises performing planarization process on the control terminal 601 and the $M_8XY_6$ channel layer 501 by chemical mechanical polishing to remove horizontal portions of the control terminal 601 and the $M_8XY_6$ channel layer 501 completely.

Further, between the step 30 and the step 40, the method further comprises forming one or more dielectric layers on the surface of the $M_8XY_6$ channel layer 501 by electron beam evaporation, chemical vapor deposition, pulsed laser deposition, atomic layer deposition, spin coating or magnetron sputtering, with a thickness of 0.5 nm to 50 nm. The planarizing comprises performing planarization process on the control terminal 601, the dielectric layer, and the $M_8XY_6$ channel layer 501 by chemical mechanical polishing to remove horizontal portions of the control terminal 601, the dielectric layer, and the $M_8XY_6$ channel layer 501 completely.

As a preferred embodiment, the manufacture process of the three-terminal atomic switching device of the present invention will be described in detail with reference to FIGS. 4 to 7, which specifically includes the steps of:

Step 1: Manufacturing a Source Terminal and a Drain Terminal.

Figure 4:
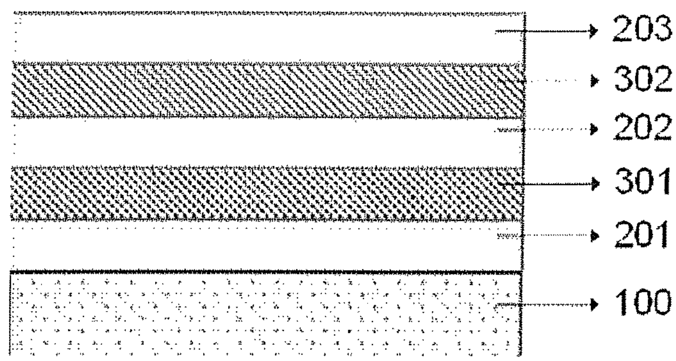
FIGS. 4 to 7 are process flow charts for manufacturing a three-terminal atomic switching device according to an embodiment of the present invention.

As shown in FIG. 4, this step comprises forming a source terminal 301 and a drain terminal 302 in a stack structure on a Si substrate 100 in this order, and isolating, by insulating dielectrics, the Si substrate 100 from the source terminal 301 and also the source terminal 301 from the drain terminal 302. As a preferred embodiment, the Si substrate 100 and the source terminal 301 are isolated from each other by a first insulating dielectric layer 201, and the source terminal 301 and the drain terminal 302 are isolated from each other by a second insulating dielectric layer 202, and the drain terminal 302 is covered with a third Insulating dielectric layer 203.

The source terminal 301 and the drain terminal 302 may be formed by chemical plating or sputtering. As a preferred embodiment, the material used in the source terminal 301 and the drain terminal 302 in this embodiment is a conductive electrode of metal W, and is formed by sputtering with a thickness of 5 nm to 100 nm.

The first to third insulating dielectric layers 201, 202, 203 may be formed by chemical vapor deposition or sputtering, and the material used may comprise SiN, SiO, SiON, or $SiO_2$, or $SiO_2$ doped with C, P or F. As a preferred embodiment, the first to third insulating dielectric layers 201, 202, and 203 are formed of $SiO_2$ by chemical vapor deposition with a thickness of 10 nm to 100 nm.

Step 2: Etching a Vertical Trench.

Figure 5:
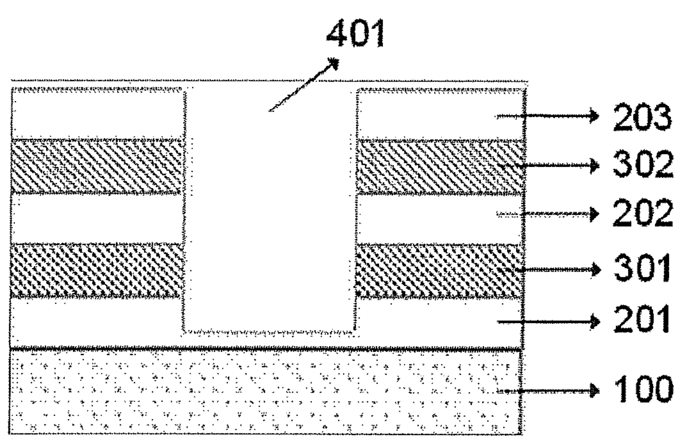

As shown in FIG. 5, this step comprises etching the third insulating dielectric layer 203, the drain terminal 302, the second insulating dielectric layer 202, the source terminal 301 and the first insulating dielectric layer 201 by photolithography and etching, and the terminal 301 is etched through and the first insulating dielectric layer 201 is not etched through to form a vertical trench 401. In this step, the photolithography may comprise conventional photolithography, electron beam exposure, nano-imprinting or other pattern transfer technology. The etching may comprise dry etching or wet etching. For the etching of the multiple layers, a single step etching process can be used to form the trench at one time, or alternatively a multi-step etching process can be used to etch the insulating dielectric layers and the drain terminal separately.

Step 3: Forming an $M_8XY_6$ Channel Layer 501 in the Trench 401.

Figure 6:
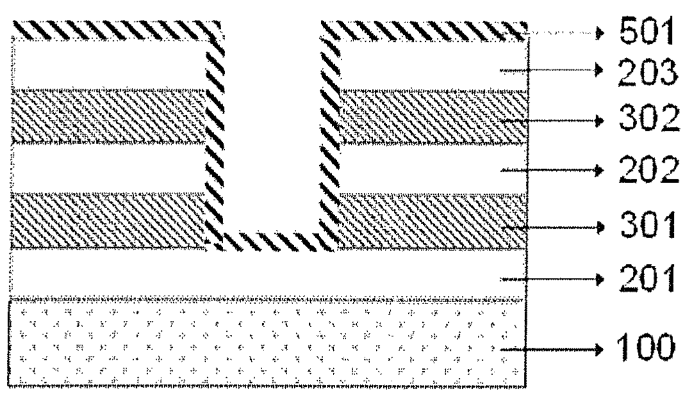

As shown in FIG. 6, as a preferred embodiment, a material used for the $M_8XY_6$ channel layer 501 may be $Cu_8GeS_6$ or $Ag_8GeS_6$, and the $M_8XY_6$ channel layer 501 may be deposited by single target sputtering or multi-target co-sputtering with a thickness of 5 nm to 200 nm.

Step 4: forming a control terminal 601 on the $M_8XY_6$ channel layer 501 in the trench 401.

Figure 7:
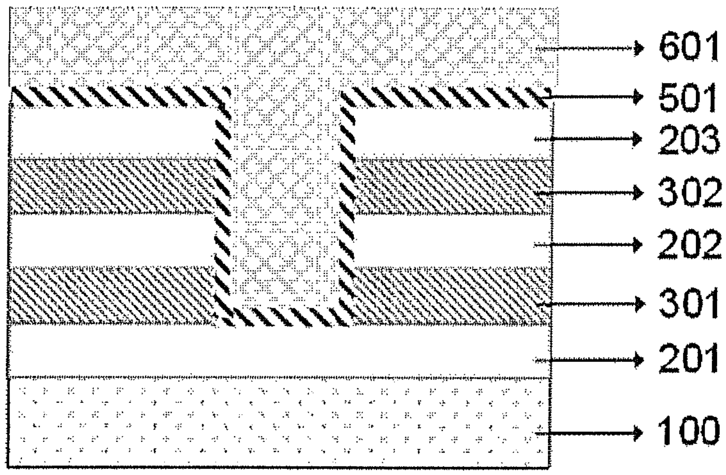

As shown in FIG. 7, as a preferred embodiment, a material used for the control terminal 601 may be a multi-layer composite electrode of one or more of Ti, TiN, Ta, TaN, Ru, or Cu, and the control terminal 601 may be manufactured by sputtering, atom Chemical vapor deposition, or plating with a thickness of 10 nm to 1000 nm.

Step 5: planarizing the control terminal 601 and the $M_8XY_6$ channel layer 501.

This step comprises performing planarization on the control terminal 601 and the $M_8XY_6$ channel layer 501 by chemical mechanical polishing, to remove of a horizontal portion of the control terminal 601 of completely removed, and also remove a horizontal portion of the $M_8XY_6$ channel layer 501 partially. Thus, the patterning of the bit line is completed, as shown in FIG. 2.

Thereby, the vertical cross-array structure with a self-gating functionality for a resistive memory shown in FIG. 2 is completed.

Further, as another preferred embodiment, there may be one or more dielectric layers further provided between the $M_8XY_6$ channel layer 501 and the control terminal 601. The one or more dielectric layers are deposited by electron beam evaporation, chemical vapor deposition, pulsed laser deposition, atomic layer deposition, spin coating or magnetron sputtering with a thickness of 0.5 nm to 50 nm after forming the $M_8XY_6$ channel layer 501 in the trench 401 in step 3. Thus, the above-described step 4 of forming a control terminal 601 on the $M_8XY_6$ channel layer 501 in the trench 401 comprises forming the control terminal 601 on the dielectric layer(s) in the trench 401, and detailed descriptions thereof will be omitted here.

Preferably, the dielectric layer may be any selected from an inorganic material of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO, or STO, or any organic material.

Many different embodiments may be made without departing from the spirit and scope of the invention. It is to be understood that the invention is not limited to the specific embodiments described in the specification, except as defined in the appended claims.

Figure 8:
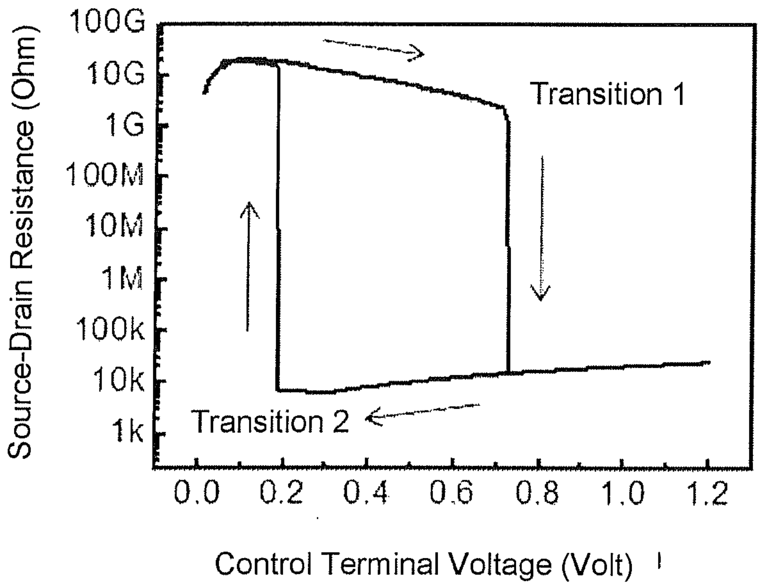
FIG. 8 is a schematic diagram showing the relationship between a source-drain resistance and a control terminal voltage of a three-terminal atomic switching device according to an embodiment of the present invention.

FIG. 8 is a schematic diagram showing the relationship between the control terminal voltage and the channel resistance of the three-terminal atomic switching device of the present invention. As shown in FIG. 8, the channel resistance of the three-terminal atomic switching device starts with a high-impedance state, i.e., the 'off' state. When the control terminal voltage reaches 0.7 V, the channel resistance decreases rapidly, and thus the device becomes 'open' state. When the control terminal voltage gradually reduces to 0.2V, the source-drain resistance increases rapidly, and thus the device becomes 'off' state again. The switching ratio of the three-terminal atomic switching device can reach more than $10^5$, and thus the read crosstalk of the cross-array structure can be effectively inhibit to avoid misreading occurring.

In the foregoing detailed description, the objects, technical solutions and advantages of the invention has been further described in detail. It is to be understood that the foregoing description provides only some specific embodiments of the invention and is not intended to limit the invention. Any modifications, equivalents, improvements, and the like without departing from the spirit and principle of the invention are intended to be included within the scope of the present invention.

What is claimed is:

1. A three-terminal atomic switching device, comprising:

a stack structure comprising a source terminal and a drain terminal;

a vertical trench formed by etching the stack structure;

an $M_8XY_6$ channel layer formed on an inner wall and a bottom of the vertical trench; and a control terminal formed on a surface of the $M_8XY_6$ channel layer, and the control terminal fills the vertical trench.

2. The three-terminal atomic switching device according to claim 1, wherein in the stack structure comprising the source terminal and the drain terminal, the drain terminal is formed on the source terminal, and the source terminal is isolated from the drain terminal by a second insulating dielectric layer, and the drain terminal is further covered with a third insulating dielectric layer, and the source terminal is isolated from a substrate by a first insulating dielectric layer thereunder.

3. The three-terminal atomic switching device according to claim 2, wherein, the source terminal and the drain terminal are made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO;

the source terminal and the drain terminal are formed by electron beam evaporation, chemical vapor deposition, pulsed laser deposition, atomic layer deposition or magnetron sputtering with a thickness of 1 nm to 500 nm.

4. The three-terminal atomic switching device according to claim 2, wherein the vertical trench penetrates through the third insulating dielectric layer covering the drain terminal, the drain terminal, the second insulating dielectric layer between the source terminal and the drain terminal, and the source terminal in this order, wherein, the bottom of the vertical trench is formed in the first insulating dielectric layer below the source terminal.

5. The three-terminal atomic switching device according to claim 1, wherein in the $M_8XY_6$ channel layer formed on the inner wall and the bottom of the vertical trench, M is any one of Cu, Ag, Li, Ni or Zn, X is any one of Ge, Si, Sn, C or N, and Y is any one of Se, S, O, or Te.

6. The three-terminal atomic switching device according to claim 5, wherein the $M_8XY_6$ channel layer comprises a $M_8XY_6$ material, doped with one or more of N, P, Zn, Cu, Ag, Li, Ni, Zn, Ge, Si, Sn, C, N, Se, S, O, Te, Br, Cl, F, or I.

7. The three-terminal atomic switching device according to claim 1, wherein the $M_8XY_6$ channel layer is formed by electron beam evaporation, chemical vapor deposition, pulsed laser deposition, atomic layer deposition, or magnetron sputtering with a thickness of 1 nm to 500 nm.

8. The three-terminal atomic switching device according to claim 1, wherein the control terminal is formed in the vertical trench with the inner wall thereof covered with the $M_8XY_6$ channel layer, and a top surface of the control terminal is flushed with a top surface of the third insulating dielectric layer covering the drain terminal.

9. The three-terminal atomic switching device according to claim 1, wherein, the control terminal is made of any conductive material selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO, or IZO, or an alloy of any two or more conductive materials selected from a metal material of W, Al, Cu, Au, Ag, Pt, Ru, Ti, Ta, Pb, Co, Mo, Ir or Ni, or a metal compound of TiN, TaN, $IrO_2$, CuTe, $Cu_3Ge$, ITO or IZO;

the control terminal is formed by electron beam evaporation, chemical vapor deposition, pulsed laser deposition, atomic layer deposition or magnetron sputtering.

10. The three-terminal atomic switching device according to claim 1, further comprising one or more dielectric layers between the $M_8XY_6$ channel layer and the control terminal, which are formed by electron beam evaporation, chemical vapor deposition, pulsed laser deposition, atomic layer deposition, spin coating or magnetron sputtering with a thickness of 0.5 nm to 50 nm.

11. The three-terminal atomic switching device according to claim 10, wherein the dielectric layer is made of any one selected from an inorganic material of CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO or STO, or any one selected from an organic material of TCNQ, PEDOT, P3HT, PCTBT, and the like.

12. A method of manufacturing a three-terminal atomic switching device, comprising:

forming a stack structure comprising a source terminal and a drain terminal;

etching the stack structure to form a vertical trench;

forming an $M_8XY_6$ channel layer on an inner wall and a bottom of the vertical trench; and forming a control terminal on a surface of the $M_8XY_6$ channel layer, wherein the control terminal fills the vertical trench.

13. The method according to claim 12, wherein the step of forming a stack structure comprising a source terminal and a drain terminal comprises forming firstly a first insulating dielectric layer on a substrate, and then, forming the source terminal on the first insulating dielectric layer, and then, forming a second insulating dielectric layer on the source terminal, and then, forming the drain terminal on the second insulating dielectric layer, and finally, forming a third insulating dielectric layer on the drain terminal, thus forming the stack structure comprising the source terminal and the drain terminal.

14. The method according to claim 13, wherein the source terminal and the drain terminal are formed by electron beam evaporation, chemical vapor deposition, pulsed laser deposition, atomic layer deposition, or magnetron sputtering, and the first to third insulating dielectric layers are formed by chemical vapor deposition or sputtering.

15. The method according to claim 12, wherein the step of etching the stack structure to form a vertical trench comprises etching through the third insulating dielectric layer, the drain terminal, the second insulating dielectric layer, and the source terminal in the stack structure by photolithography and etching, and the etching stops in the first insulating dielectric layer below the source terminal.

16. The method according to claim 15, wherein the photolithography comprises conventional photolithography, electron beam exposure, or nano-imprinting, and the etching comprises dry etching or wet etching; a single step etching process is used to form the trench at one time, or alternatively a multi-step etching process is used to etch the insulating dielectric layers and the drain terminal separately.

17. The method according to claim 12, wherein the step of forming an $M_8XY_6$ channel layer on an inner wall and a bottom of the vertical trench comprises forming the $M_8XY_6$ channel layer by electron beam evaporation, chemical vapor deposition, pulsed laser deposition, atomic layer deposition, or magnetron sputtering.

18. The method according to claim 12, wherein the step of forming a control terminal on a surface of the $M_8XY_6$ channel layer comprises forming the control terminal in the vertical trench with the inner wall thereof covered with the $M_8XY_6$ channel layer by any one of electron beam evaporation, chemical vapor deposition, pulsed laser deposition, atomic layer deposition, or magnetron sputtering.

19. The method according to claim 18, wherein the step of forming a control terminal 601 on a surface of the $M_8XY_6$ channel layer further comprises:

planarizing the control terminal and the $M_8XY_6$ channel layer, forming a bit line for a vertical cross-array structure, thereby forming a three-terminal atomic switching device.

20. The method according to claim 19, wherein the planarizing comprises performing planarization process on the control terminal and the $M_8XY_6$ channel layer by chemical mechanical polishing to remove horizontal portions of the control terminal and the $M_8XY_6$ channel layer completely.

21. The method according to claim 12, wherein between the step of forming an $M_8XY_6$ channel layer on an inner wall and a bottom of the vertical trench and the step of forming a control terminal on a surface of the $M_8XY_6$ channel layer, the method further comprises:

forming one or more dielectric layers on the surface of the $M_8XY_6$ channel layer by electron beam evaporation, chemical vapor deposition, pulsed laser deposition, atomic layer deposition, spin coating or magnetron sputtering, with a thickness of 0.5 nm to 50 nm.

22. The method according to claim 21, wherein the planarizing comprises performing planarization process on the control terminal, the dielectric layer, and the $M_8XY_6$ channel layer by chemical mechanical polishing to remove horizontal portions of the control terminal, the dielectric layer, and the $M_8XY_6$ channel layer completely.

* * * * *